(12) United States Patent
Kwon et al.

(10) Patent No.: US 8,618,671 B2
(45) Date of Patent: Dec. 31, 2013

(54) SEMICONDUCTOR PACKAGES HAVING PASSIVE ELEMENTS MOUNTED THEREONTO

(75) Inventors: Heung-kyu Kwon, Seongnam-si (KR); Hyung-Jun Lim, Suwon-si (KR); Byeong-yeon Cho, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 233 days.

(21) Appl. No.: 12/904,502

(22) Filed: Oct. 14, 2010

(65) Prior Publication Data

US 2011/0084380 A1   Apr. 14, 2011

(30) Foreign Application Priority Data

Oct. 14, 2009   (KR) .................. 10-2009-0097734

(51) Int. Cl.
*H01L 23/02* (2006.01)
*H01L 23/48* (2006.01)
*H01L 23/52* (2006.01)
*H01L 29/40* (2006.01)
*H01L 21/00* (2006.01)

(52) U.S. Cl.
USPC .......... 257/777; 257/686; 257/690; 438/107; 438/108; 438/109

(58) Field of Classification Search
USPC .......... 438/106–127; 257/678–733, 773–777
See application file for complete search history.

(56) References Cited

U.S. PATENT DOCUMENTS

| | | | | |
|---|---|---|---|---|
| 5,994,166 A | * | 11/1999 | Akram et al. ................. | 438/108 |
| 6,618,267 B1 | * | 9/2003 | Dalal et al. .................... | 361/767 |
| 6,734,539 B2 | * | 5/2004 | Degani et al. ................. | 257/686 |
| 7,180,165 B2 | | 2/2007 | Ellsberry et al. | |
| 7,242,081 B1 | * | 7/2007 | Lee ............... | 257/686 |
| 7,312,519 B2 | * | 12/2007 | Song et al. .................... | 257/686 |
| 7,359,213 B2 | * | 4/2008 | Vasudivan et al. ............ | 361/763 |
| 7,378,297 B2 | * | 5/2008 | Beyne .......................... | 438/108 |
| 7,586,184 B2 | * | 9/2009 | Hung et al. ................... | 257/686 |
| 7,745,918 B1 | * | 6/2010 | Woodyard .................... | 257/686 |
| 2005/0023659 A1 | * | 2/2005 | Lee et al. ..................... | 257/678 |
| 2005/0258529 A1 | * | 11/2005 | Green et al. .................. | 257/686 |
| 2006/0197209 A1 | * | 9/2006 | Choi et al. .................... | 257/686 |
| 2006/0245308 A1 | * | 11/2006 | Macropoulos et al. .......... | 369/1 |
| 2008/0185719 A1 | * | 8/2008 | Cablao et al. ................. | 257/738 |
| 2008/0217708 A1 | * | 9/2008 | Reisner et al. ................ | 257/416 |
| 2008/0224306 A1 | * | 9/2008 | Yang ............................ | 257/725 |
| 2009/0050994 A1 | * | 2/2009 | Ishihara et al. ............... | 257/432 |

FOREIGN PATENT DOCUMENTS

| | | |
|---|---|---|
| KR | 10-2002-0073648 | 9/2002 |
| KR | 10-0708050 | 4/2007 |
| KR | 10-2008-0082862 | 9/2008 |

* cited by examiner

*Primary Examiner* — Fernando L Toledo
*Assistant Examiner* — Karen Kusumakar
(74) *Attorney, Agent, or Firm* — Harness, Dickey & Pierce, P.L.C.

(57) ABSTRACT

A semiconductor package onto which a plurality of passive elements is mounted. A substrate includes a first surface and a second surface. A semiconductor chip is on one of the first surface and the second surface of the substrate. A plurality of passive elements are on the substrate. The plurality of passive elements include a plurality of first passive elements and a plurality of second passive elements that are taller than the plurality of first passive elements. The plurality of first passive elements are on at least one of the first surface and the second surface, and at least two of the plurality of second passive elements are on the second surface.

11 Claims, 13 Drawing Sheets

SEMICONDUCTOR PACKAGES HAVING PASSIVE ELEMENTS MOUNTED THEREONTO

CROSS-REFERENCE TO RELATED APPLICATIONS

This application claims the benefit of Korean Patent Application No. 10-2009-0097734, filed on Oct. 14, 2009, in the Korean Intellectual Property Office, the entire contents of which are incorporated herein by reference.

BACKGROUND

Inventive concepts relate to semiconductor packages, and more particularly, to semiconductor packages on which a plurality of passive elements are mounted.

In recent times, miniaturization, high integration, and multi-functioning of electronic products, such as portable terminals, are required, and thus, semiconductor products are miniaturized. To satisfy the requirements, a system-on-chip (SOC) in which a plurality of semiconductor chips are configured as one chip, or a system-in-package (SIP) in which the semiconductor chips are integrated into one package has been developed.

Functional elements and a semiconductor package are mounted on a package substrate in order to prevent deterioration of the signal characteristics of electronic products including the semiconductor package.

SUMMARY

However, it is difficult to mount high functional elements on the substrate and such an operation increases the height of the semiconductor package. Further, a wide ball pitch is needed in order to obtain a sufficient bonding margin of an upper package and the substrate having passive elements embedded therein, which increases the height and size of the semiconductor package.

Inventive concepts provide a semiconductor package on which a plurality of passive elements are mounted that reduces the height and size of the semiconductor package.

According to an aspect of inventive concepts, there is provided a semiconductor package including a substrate having a first surface and a second surface, a semiconductor chip disposed on one of the first surface and the second surface of the substrate, and a plurality of passive elements on the substrate. The plurality of passive elements include a plurality of first passive elements and a plurality of second passive elements that are taller than the plurality of first passive elements. The plurality of first passive elements are on at least one of the first surface and the second surface, and at least two of the plurality of second passive elements are on the second surface.

The plurality of first passive elements may include at least one of a capacitor and a resistor. The plurality of second passive elements may include at least one of an inductor, an oscillator, and a tantalum capacitor.

The semiconductor chips may be on the first surface, a plurality of chip pads of the semiconductor chip may be bonded to a plurality of connection pads of the substrate through a plurality of wires, the plurality of first passive elements may be on the first surface, and a sealing member covers the semiconductor chip, the plurality of wires, and the plurality of first passive elements on the first surface. Or, if the semiconductor chips are disposed on the second surface, the plurality of chip pads of the semiconductor chip are bonded to the plurality of connection pads of the substrate through the plurality of wires, and the sealing member covers the semiconductor chip and the plurality of wires. The plurality of chip pads of the semiconductor chip may be bonded to the plurality of connection pads of the substrate through a plurality of solder balls, and an under-fill material is charged between the semiconductor chip and the substrate.

The semiconductor package may further include an upper package on the first surface of the substrate. At least one of the plurality of second passive elements is on a surface of the upper package facing the substrate. The remaining plurality of second passive elements may be on a surface that faces the substrate of the upper package. The at least one second passive element on the upper package passes through the substrate through the openings.

According to another aspect of inventive concepts, there is provided a semiconductor package including a substrate having a first surface and a second surface, a semiconductor chip on the first surface of the substrate, and a plurality of passive elements on the substrate. The plurality of passive elements include a plurality of first passive elements and a plurality of second passive elements that are taller than the plurality of first passive elements. The plurality of first passive elements are on the second surface, and the plurality of second passive elements are on the first surface. An upper package is on the second surface of the substrate and a plurality of test terminals are on the second surface of the substrate.

According to another aspect of inventive concepts, there is provided a semiconductor package including a substrate having a first surface, a second surface, and at least one opening, a semiconductor chip on the first surface of the substrate, and a plurality of passive elements. The plurality of passive elements includes a plurality of first passive elements and a plurality of second passive elements that are taller than the plurality of first passive elements. An upper package is on the first surface of the substrate. The plurality of first passive elements are on at least one of the first surface and the second surface. At least one of the plurality of second passive elements is on a surface of the upper package that faces the first surface of the substrate so that the at least one of the plurality of second passive elements passes through the substrate through the at least one opening, and the remaining second passive elements are on the second surface of the substrate.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
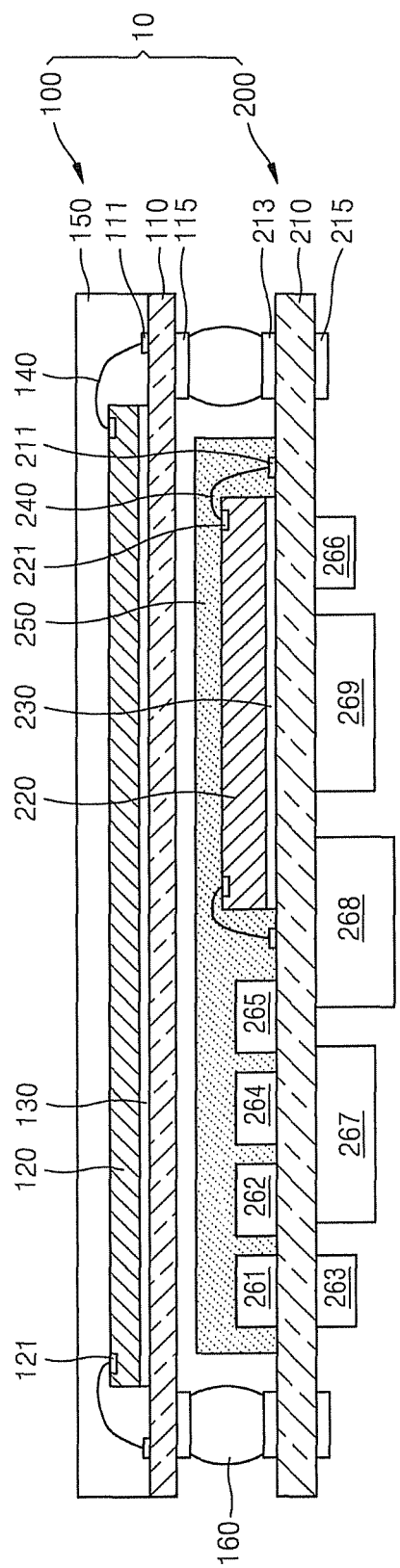
FIG. 1 is a cross-sectional view of a semiconductor package on which a plurality of passive elements is mounted according to an example embodiment.

The attached drawings for illustrating example embodiments of inventive concepts are referred to in order to gain a sufficient understanding of inventive concepts, the merits thereof, and objectives accomplished by the implementation of inventive concepts.

Hereinafter, inventive concepts will be described in detail by explaining example embodiments with reference to the attached drawings. In the drawings, lengths and sizes of layers and regions may be exaggerated for clarity. Like reference numerals in the drawings denote like elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a semiconductor package 10 according to an example embodiment. Referring to FIG. 1, the semiconductor package 10 may include an upper package 100 and a lower package 200. The upper package 100 may include an upper substrate 110 and an upper semiconductor chip 120 that is installed on a first surface of the upper substrate 110. The upper substrate 110 may include a plurality of first connection pads 111 that are arranged on the first surface and a plurality of second connection pads 115 that are arranged on a second surface that is an opposite surface of the first surface. The upper semiconductor chip 120 may include a plurality of stacked chips.

The upper semiconductor chip 120 may be mounted onto the first surface of the upper substrate 110 through an adhesive 130. Alternatively, the upper semiconductor chip 120 may be physically mounted onto the upper substrate 110 and may be electrically connected to a lower semiconductor chip 220 through a set board (not shown). A plurality of chip pads 121 of the upper semiconductor chip 120 may be electrically connected to the first connection pads 111 of the upper substrate 110 through a plurality of wires 140. Alternatively, although not shown, the chip pads 121 of the upper semiconductor chip 120 may be flip-chip bonded to the first connection pads 111 of the upper substrate 110 through a plurality of solder balls.

An upper sealing member 150 may be disposed on the first surface of the upper substrate 110 in order to cover the upper semiconductor chip 120 and the wires 140. A plurality of connection terminals 160, for example, solder balls, may be arranged on the second connection pads 115 of the upper substrate 110 in order to electrically connect the lower package 200.

The lower package 200 may include a lower substrate 210 and a lower semiconductor chip 220. The lower substrate 210 may include a plurality of first connection pads 211 and a plurality of third connection pads 213 that are arranged on a first surface and a plurality of second connection pads 215 that are arranged on a second surface that faces the first surface. The lower semiconductor chip 220 may be mounted onto the first surface of the lower substrate 210 through an adhesive 230. The lower semiconductor chip 220 may include a plurality of stacked chips. The lower semiconductor chip 220 may include a control chip. Also, the lower semiconductor chip 220 may be mounted onto the lower substrate 210 using the surface mount technology (SMT). The lower semiconductor chip 220 may be electrically connected to the connection terminals 160 through a set board (not shown).

A plurality of passive elements 261-269 may be arranged on the lower substrate 210. The first passive elements 261-266, for example, the capacitors 261-263 and the resistors 264-266, that are relatively shorter than the second passive elements 267-269 may be arranged on the first surface and/or the second surface of the lower substrate 210. The second passive elements 267-269 that are relatively taller than the first passive elements 261-266 may be arranged on the second surface that is an opposite surface of the first surface on which the upper package 100 is installed. For example, the oscillator 267, the inductor 268, and the tantalum capacitor 269, etc. may be arranged on the second surface of the lower substrate 210. The passive elements 261-269 may be mounted onto the lower substrate 210 through an adhesive (not shown). Also, the passive elements 261-269 may be mounted onto the lower substrate 210 using the SMT. The passive elements 261-269 may be electrically connected to the connection terminals 160 through a set board (not shown).

A plurality of chip pads 221 of the lower semiconductor chip 220 may be electrically connected to the first connection pads 211 through a plurality of wires 240. A lower sealing member 250 may be disposed on the first surface of the lower substrate 210 in order to cover some of the first passive elements 261, 262, 264, and 265, the lower semiconductor chip 220, and the wires 240.

Although not shown, a plurality of solder balls (not shown), as external connection terminals, may be arranged on the second connection pads 215 of the lower substrate 210 in order to connect batteries or power management units (PMUs). The second connection pads 215 may be used as test terminals. Universal serial buses (USBs), charging jacks, or toggle keys may be mechanically or electrically connected to the second connection pads 215. The second connection pads 215 may be connected to the external elements stated above by direct soldering, film attaching, or socket attaching. A plurality of additional terminals may be arranged on the upper packages 100 and/or the lower package 200 in order to provide signals for operating the upper semiconductor chip 120 and the lower semiconductor chip 220.

Figure 2:
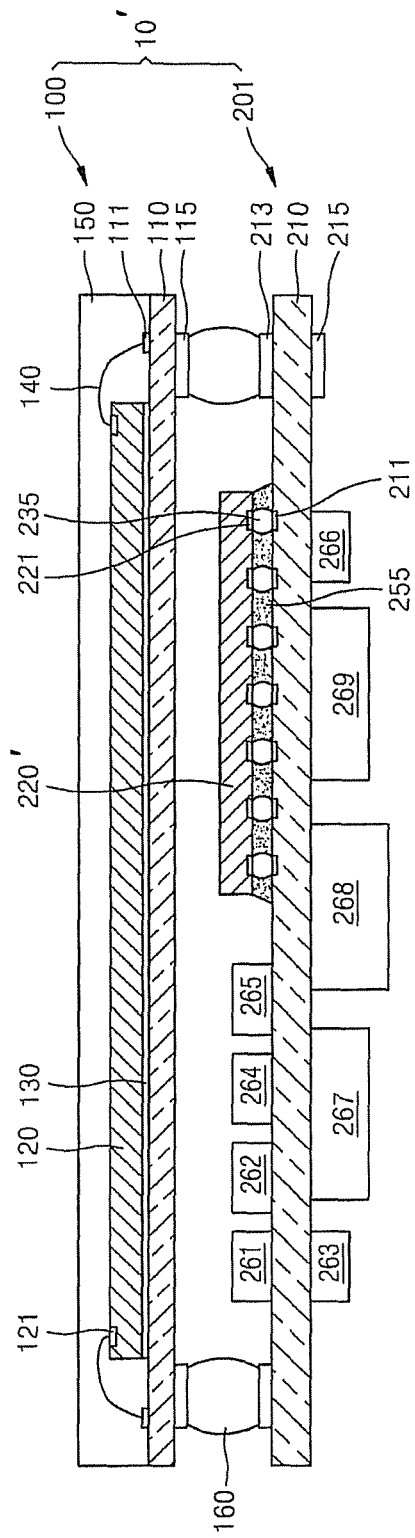
FIG. 2 is a cross-sectional view of a semiconductor package on which a plurality of passive elements is mounted according to another example embodiment.

FIG. 2 is a cross-sectional view of the semiconductor package 10' according to another example embodiment. Referring to FIG. 2, a lower semiconductor chip 220' of a lower package 201 may be flip-chip bonded to a lower substrate 210' through a plurality of solder balls 235 so that the chip pads 221 may be electrically connected to the first connection pads 211 of the lower substrate 210. An underfill material 255 may be charged between the second surface of the lower substrate 210 and the lower semiconductor chip 220 to protect the solder balls 235.

Figure 3:
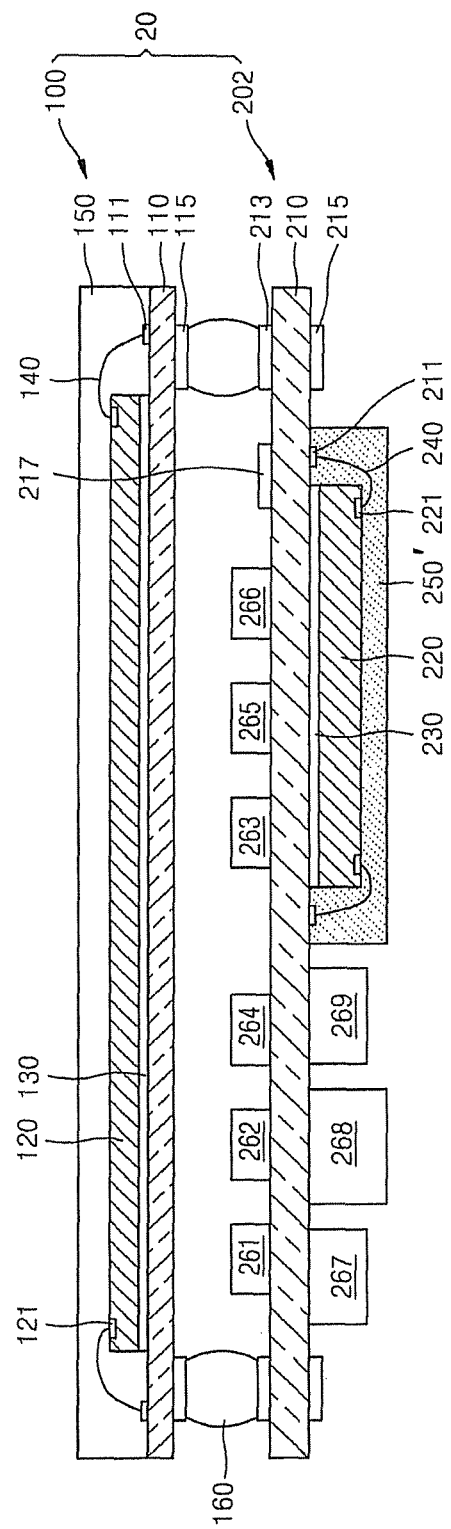
FIG. 3 is a cross-sectional view of a semiconductor package on which a plurality of passive elements is mounted according to another example embodiment.

FIG. 3 is a cross-sectional view of a semiconductor package 20 according to another example embodiment. Referring to FIG. 3, a structure of a lower package 202 of the semiconductor package 20 may be different from the different from those of the lower packages 200 and 201 of the semiconductor package 10 described with reference to FIGS. 1 and 2. The capacitors 261-263 and the resistors 264-266 that are the first passive elements may be arranged on the first surface of the lower substrate 210. The oscillator 267, the inductor 268, and the tantalum capacitor 269 may be arranged on the second surface of the lower substrate 210. The lower semiconductor chip 220 and the second passive elements 267-269 may be disposed on the second surface.

The chip pads 221 of the lower semiconductor chip 220 may be wire-bonded to the first connection pads 211 that are arranged on the second surface of the lower substrate 210 through the wires 240. A lower sealing member 250' may be disposed on the second surface to cover the lower semiconductor chip 220 and the wires 240. A plurality of fourth connection pads 217 may be further arranged on the first surface of the lower substrate 210 and may be used as test terminals that are separated from the second connection pads 215.

Figure 4:
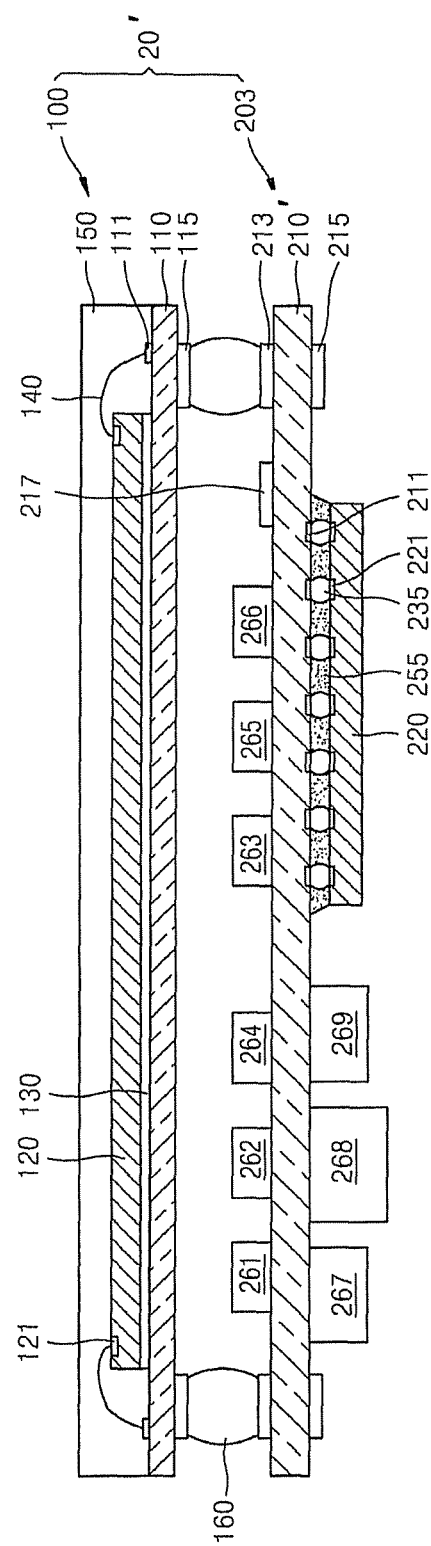
FIG. 4 is a cross-sectional view of a semiconductor package on which a plurality of passive elements is mounted according to another example embodiment.

FIG. 4 is a cross-sectional view of the semiconductor package 20' according to another example embodiment. Referring to FIG. 2, the lower semiconductor chip 220' of a lower package 203 may be flip-chip bonded to the lower substrate 210' through the solder balls 235 so that the chip pads 221 may be electrically connected to the first connection pads 211 that are arranged on the second surface of the lower substrate 210'.

Figure 5:
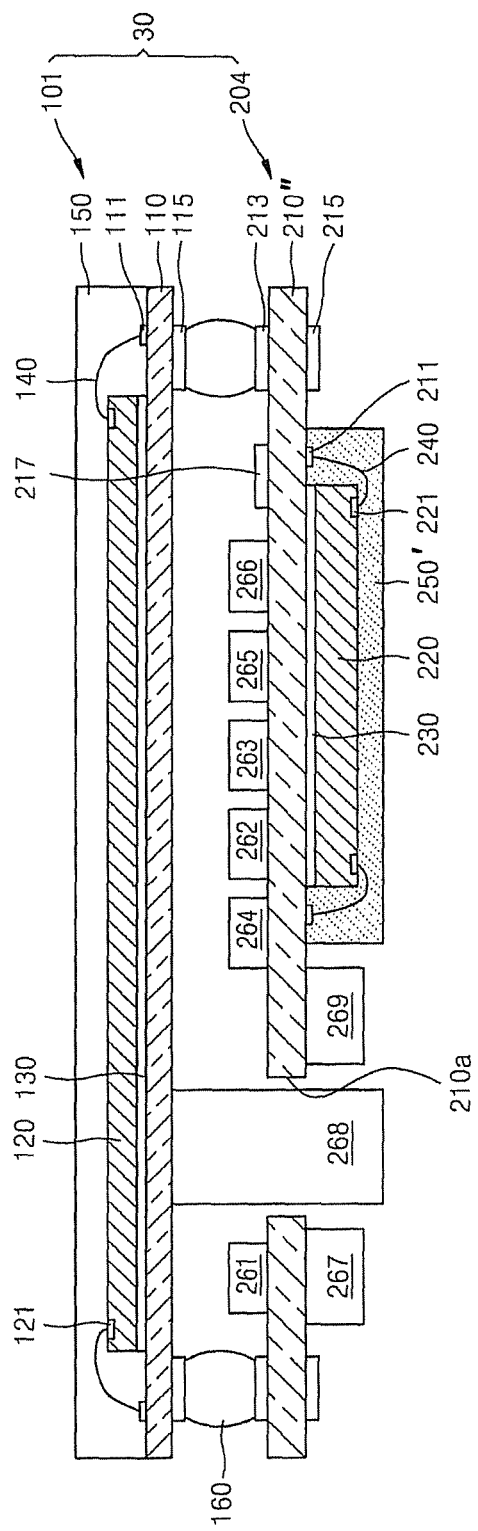
FIG. 5 is a cross-sectional view of a semiconductor package on which a plurality of passive elements is mounted according to another example embodiment.

FIG. 5 is a cross-sectional view of a semiconductor package 30 according to another example embodiment. Referring to FIG. 5, the semiconductor package 30 may include an upper package 101 and a lower package 204. The upper package 101 may have the same structure as the upper packages 100 described with reference to FIGS. 1 through 4. However, the longest one of the second passive elements 267-269, for example, the inductor 268, may be mounted onto the second surface of the upper substrate 110 that faces the lower package 204.

The lower package 204 may have the same structure as the lower package 202 described with reference to FIG. 3. However, a lower substrate 210' may include at least one opening 210a in a portion corresponding to the inductor 268. The inductor 268 may be mounted onto the second surface of the upper substrate 110 so that the lower substrate 210 passes through the at least one opening 210a. The inductor 268 may be mounted onto the second surface of the upper substrate 110 using the SMT. The inductor 268 may be connected to the connection terminals 160 through a set board (not shown).

Figure 6:
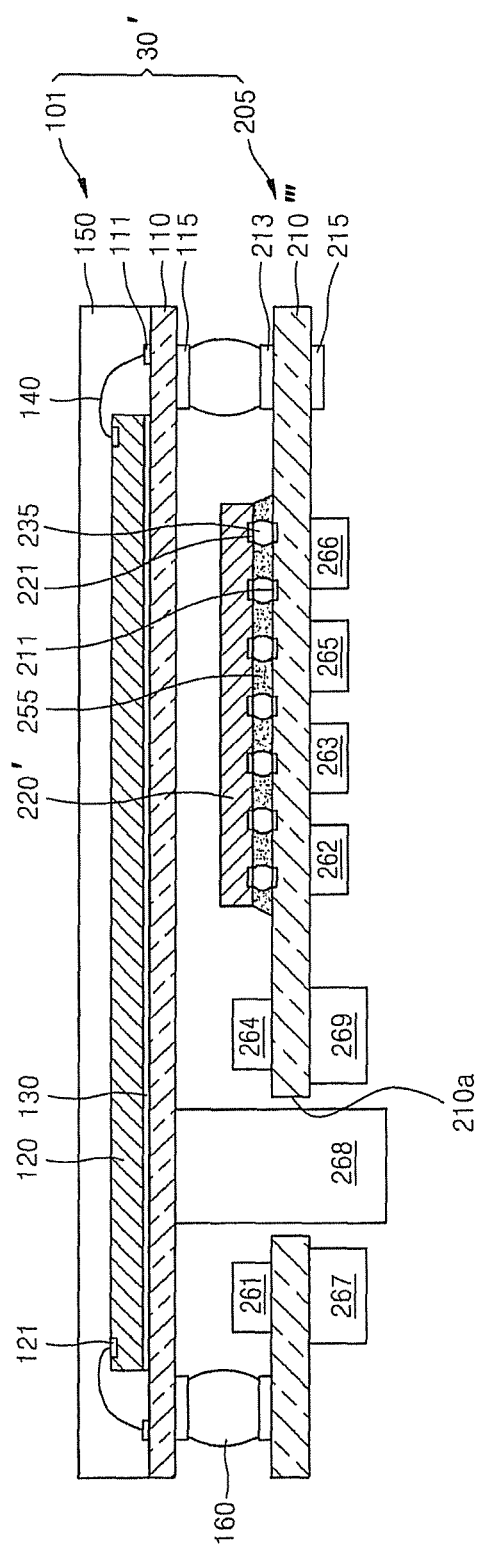
FIG. 6 is a cross-sectional view of a semiconductor package on which a plurality of passive elements is mounted according to another example embodiment.

FIG. 6 is a cross-sectional view of a semiconductor package 30' according to another embodiment. Referring to FIG. 6, the lower semiconductor chip 220' of a lower package 205 may be flip-chip bonded to the first connection pads 211 that are arranged on the first surface of a lower substrate 210''' through the solder balls 235 in the same manner as shown in FIG. 4. Some of the first passive elements 261 and 264 are arranged on the first surface. The other first passive elements 262, 263, 265, and 266 may be arranged on the second surface.

Although not shown, alternatively, the second passive elements 267-269 are arranged on the second surface of the upper substrate 110 in order to correspond that the second passive elements 267-269 may be arranged in the at least one opening 210a and pass through the lower substrate 210'''. Also, the second passive elements 267-269 are arranged on the second surface of the upper substrate 110 in order to correspond that the second passive elements 267-269 may be arranged in the at least opening 210a included in the lower substrate 210''', respectively, and pass through the lower substrate 210'''.

Figure 7:
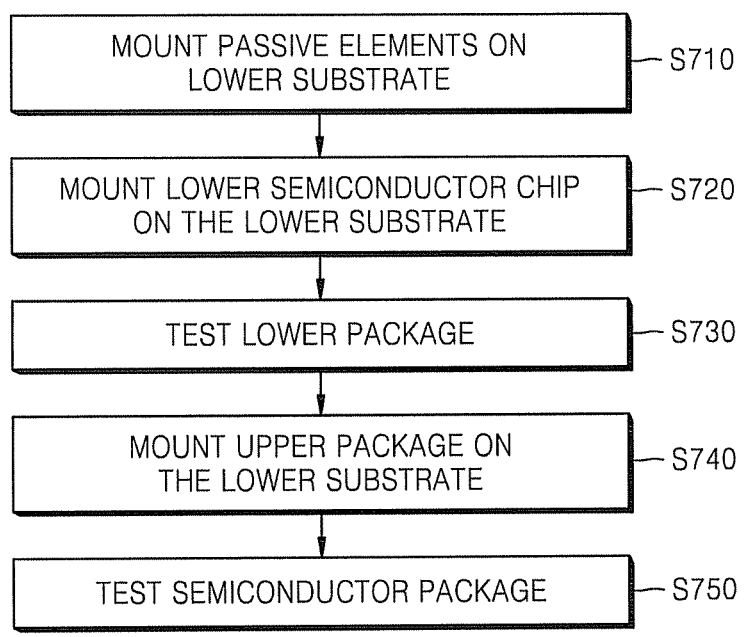
FIG. 7 is a flowchart illustrating a method of manufacturing a semiconductor package in which a plurality of passive elements is embedded, according to an example embodiment.
Figure 8A:
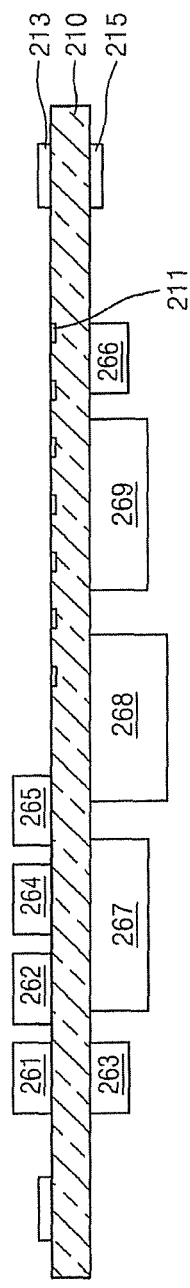
FIGS. 8A through 8C are cross-sectional views illustrating a method of manufacturing the semiconductor package of FIG. 2, according to an example embodiment.
Figure 8B:
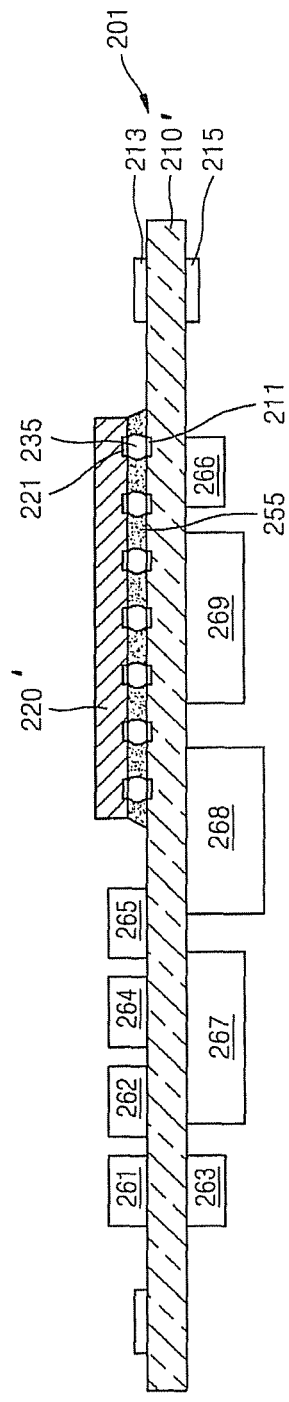
Figure 8C:
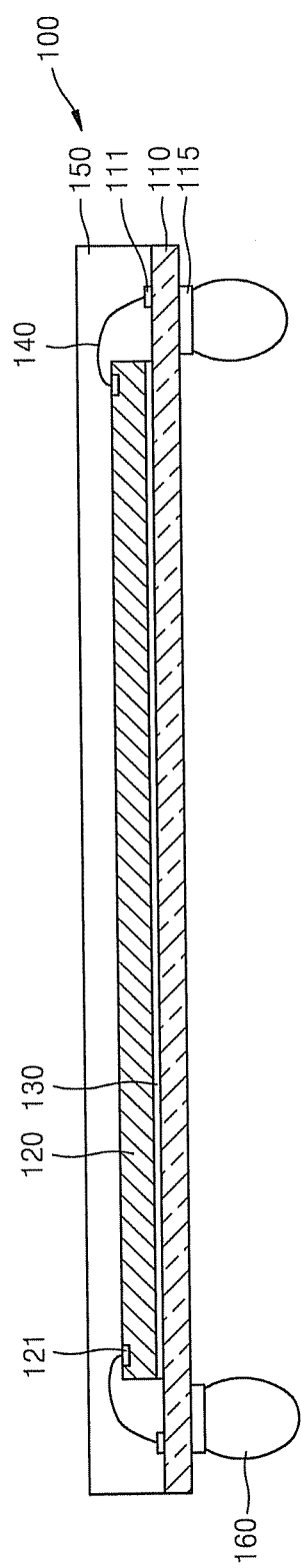

FIG. 7 is a flowchart illustrating a method of manufacturing a semiconductor package, according to an example embodiment. FIGS. 8A through 8C are cross-sectional views illustrating a method of manufacturing the semiconductor package 10, according to an example embodiment.

Referring to FIGS. 2, 7, and 8A, the passive elements 261-269 may be mounted onto the lower substrate 210' using the SMT (operation S710). The lower substrate 210' may be provided that the first connection pads 211 and the third connection pads 213 are arranged on the first surface, and the second connection pads 215 are arranged on the second surface. The lower substrate 210' may include a PCB substrate.

Some of the first passive elements 261, 262, 264, and 265 may be mounted onto the first surface of the lower substrate 210 in which the upper package 200 is mounted. The other first passive elements 263 and 266 may be mounted onto the second surface of the lower substrate 210'. The second passive elements 267-269 may be mounted onto the second surface of the lower substrate 210'.

Referring to FIGS. 2, 7, and 8B, the lower package 201 is manufactured by mounting the lower semiconductor chip 220' on the first surface of the lower substrate 210' (operation S720). The lower semiconductor chip 220' including the chip pads 221 may be provided. The solder balls 235 may be arranged on the chip pads 221. The first connection pads 211 that are arranged on the first surface of the lower substrate 210' are flip-chip bonded to the chip pads 221 of the lower semiconductor chip 220' and may be electrically connected thereto. The under-fill material 255 may be further charged between the first surface of the lower substrate 210' and the lower semiconductor chip 220' in order to cover the solder balls 235.

Thereafter, the lower package 201 may be tested (operation S730). In this regard, the second connection pads 215 of the lower substrate 210' may be used as test terminals.

Alternatively, the chip pads 211 of the lower semiconductor chip 220 of the lower package 200 may be wire-bonded to the first connection pads 211 of the lower substrate 210 through the wires 240, as shown in FIG. 1. Thereafter, the lower sealing member 250 may be further disposed on the first surface to cover some of the first passive elements 261, 262, 264, and 265, the upper semiconductor chip 220, and the wires 240.

Referring to FIGS. 2, 7, and 8C, the upper package 100 may be mounted onto the lower substrate 210' (operation S740). The upper package 100 in which the lower semiconductor chip 220' is disposed may be provided on the first surface of the upper substrate 110. The upper substrate 110 may include a PCB substrate.

The semiconductor package 10' may be manufactured by mounting the upper package 100 on the lower substrate 210'. The connection teiininals 160 of the upper substrate 110 and the third connection terminals 213 of the lower substrate 210' may be flip-chip bonded to each other and may be electrically connected to each other. In this regard, the upper package 100 and the lower semiconductor chip 220' are provided to perform the method described with reference to FIG. 8A and thus a process of mounting the lower semiconductor chip 220' and the upper package 100 may be performed with reference to FIGS. 8B and 8C.

Thereafter, the semiconductor package 10' is tested (operation S750). In this regard, the second connection pads 215 of the lower substrate 210' may be used as test terminals to test the semiconductor package 10'. If the semiconductor package is completely tested, although not shown, the second connection terminals 215 may be connected to batteries, charging jacks, or toggle keys. Thereafter, a next test operation is performed and then the semiconductor package 10' may be housed.

Figure 9A:
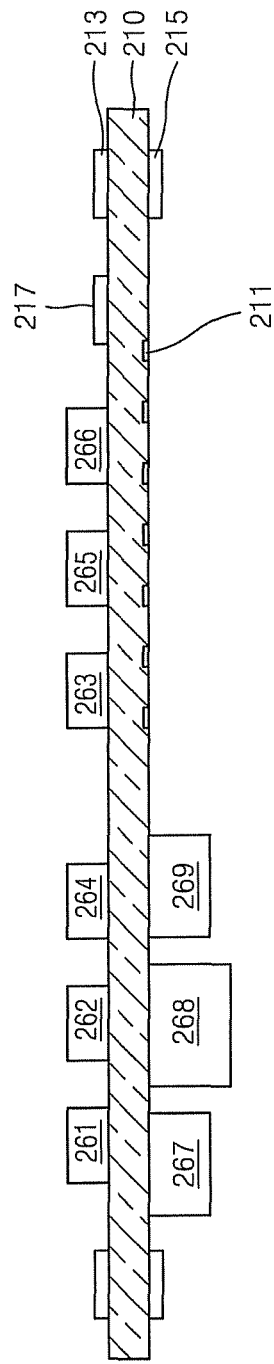
FIGS. 9A and 9B are cross-sectional views illustrating a method of manufacturing the semiconductor package of FIG. 4, according to another example embodiment.
Figure 9B:
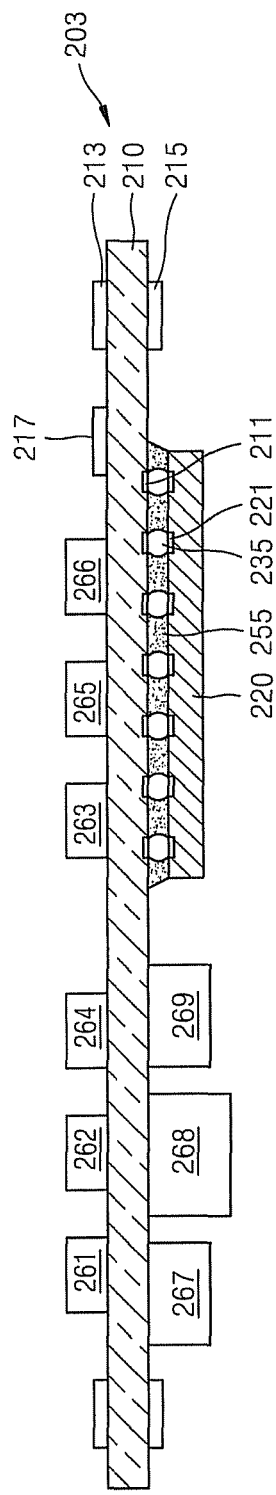

FIGS. 9A and 9B are cross-sectional views illustrating a method of manufacturing the semiconductor package of FIG. 4, according to another example embodiment.

Referring to FIGS. 4, 7, and 9A, the passive elements 261-269 may be mounted onto the lower substrate 210' using the SMT (operation S710). The lower substrate 210' may be provided. The first passive elements 261-266 may be mounted onto the first surface of the lower substrate 210' on which the upper package 200 is to be mounted, and the second passive elements 267-269 may be mounted onto the lower substrate 210'.

Referring to FIGS. 4, 7, and 9B, the lower package 200 is manufactured by mounting the lower semiconductor chip 220' on the second surface of the lower substrate 210 (operation S720). The lower semiconductor chip 200 may be provided. The solder balls 235 may be arranged on the chip pads 221 of the lower semiconductor chip 220. The chip pads 221 of the semiconductor chip 220' and the first connection pads 211 that are arranged on the second surface of the lower substrate 210' may be flip-chip bonded so that the chip pads 221 and the first connection pads 211 may be electrically connected to each other. The under-fill material 255 may be further charged between the second surface of the lower substrate 210 and the semiconductor chip 220' in order to cover the solder balls 235.

Thereafter, the lower package 203 may be tested (operation S730). In this regard, the second connection pads 215 of the lower substrate 210' may be used as test terminals to test the lower package 203. Operations 5740 and S750 may be performed in the same manner as described with reference to FIG. 8C.

Alternatively, the chip pads 211 of the lower semiconductor chip 220' of the lower package 202 may be wire-bonded to the first connection pads 211 of the lower substrate 210 through the wires 240. Thereafter, the lower sealing member 250 may be further disposed on the second surface to cover the lower semiconductor chip 220 and the wires 240.

Figure 10:
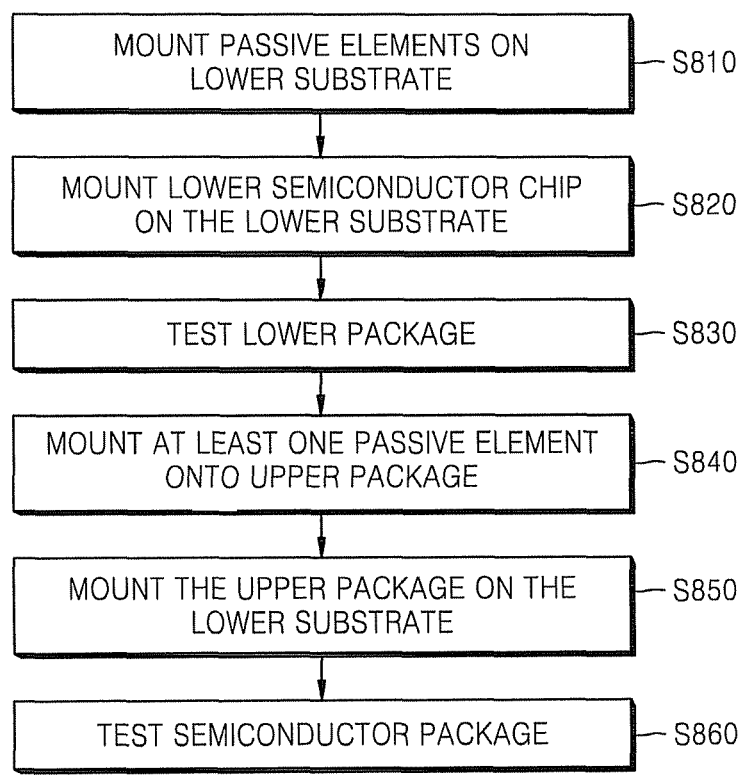
FIG. 10 is a flowchart illustrating a method of manufacturing a semiconductor package on which a plurality of passive are mounted, according to another example embodiment.
Figure 11A:
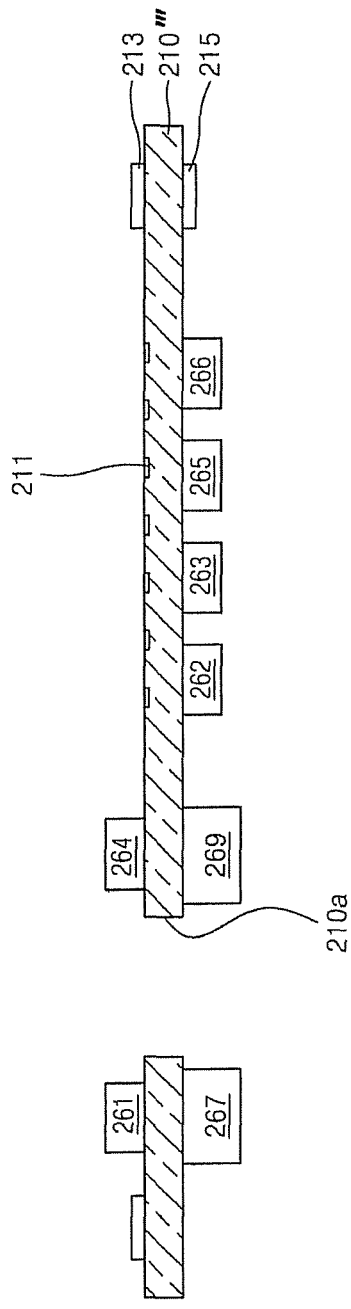
FIGS. 11A through 11C are cross-sectional views illustrating a method of manufacturing the semiconductor package of FIG. 6, according to an example embodiment.
Figure 11B:
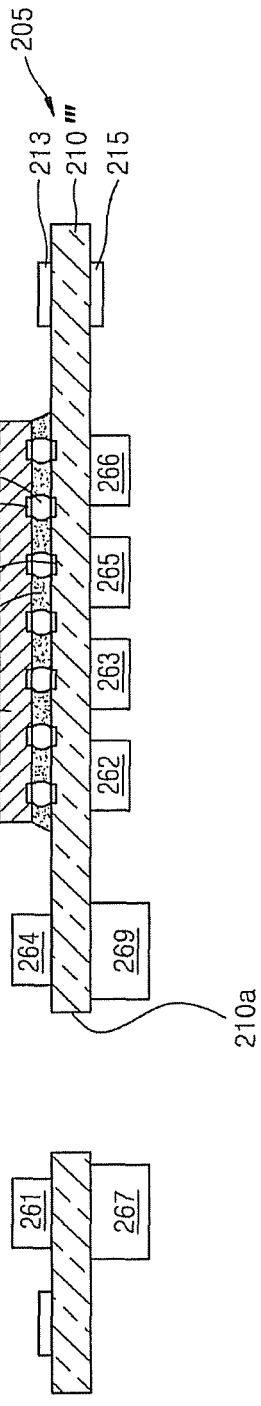
Figure 11C:
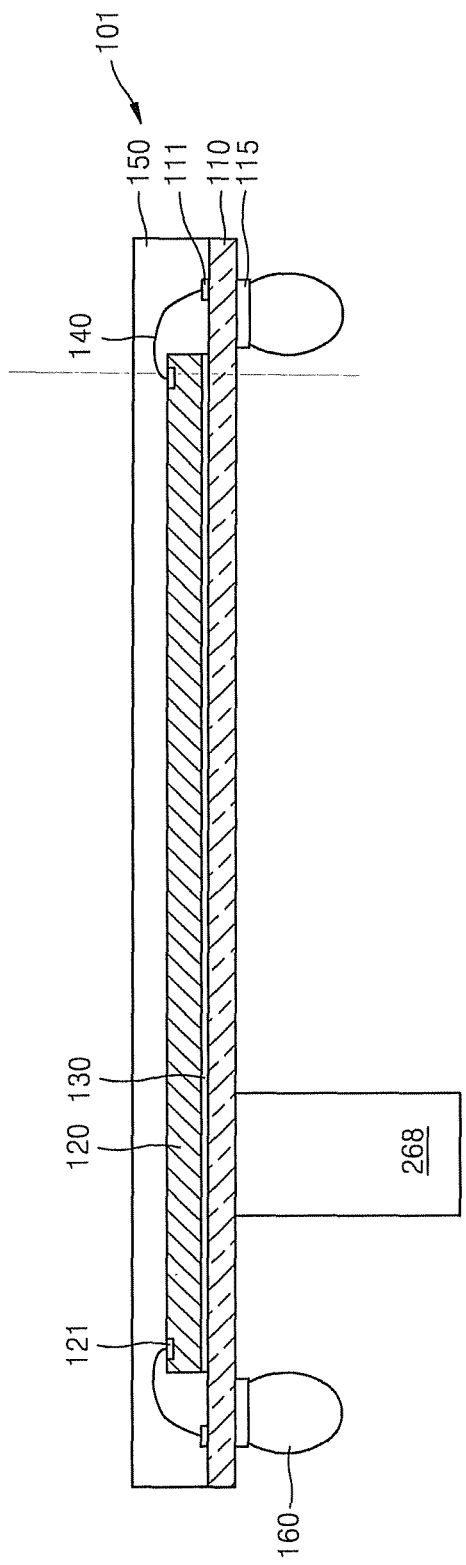

FIG. 10 is a flowchart illustrating a method of manufacturing a semiconductor package in which a plurality of passive are embedded, according to another example embodiment. FIGS. 11A through 11C are cross-sectional views illustrating a method of manufacturing the semiconductor package 30, according to an embodiment.

Referring to FIGS. 6, 10, and 11A, the first passive elements 261-266 and some of the second passive elements 267 and 269 may be mounted onto the lower substrate 210''' using the SMT (operation S810). In this regard, the first passive elements 261-266 and the some of the second passive elements 267 and 269, other than the longest second passive element 268, may be mounted onto the lower substrate 210'''. The lower substrate 210''' may be provided that the first connection pads 211 and the third connection pads 213 are arranged on the first surface and the second connection pads 215 are arranged on the second connection pads 215. The lower substrate 210''' may further include the at least one opening 210a.

Some of first passive elements 261-263 may be mounted onto the first surface of the lower substrate 210". Two of the second passive elements 267-269, for example, the second passive elements 267 and 269 may be mounted onto the second surface of the lower substrate 210".

Referring to FIGS. 6, 10, an 11B, a test operation S830 may be performed after mounting the lower semiconductor chip 220' on the first surface of the lower substrate 210''' and manufacturing the lower package 205.

Referring to FIGS. 6, 10, and 11C, the at least one of the second passive element 268 may be mounted onto the upper package 101 (operation S840). In this regard, the upper package 101 in which the upper semiconductor chip 220' is arranged may be provided on the first surface of the upper substrate 110. Thereafter, the at least one of the second passive element 268 may be mounted onto the second surface of the upper substrate 110. The at least one of the second passive element 268 may include an inductor. The at least one of the second passive element 268 may be mounted onto the second surface of the upper substrate 110 to correspond to the opening 210a of the lower substrate 210" '.

Operations 5850 and S860 may be performed in the same manner as described with reference to FIG. 8C.

While inventive concepts have been particularly shown and described with reference to example embodiments thereof, it will be understood that various changes in faun and details may be made therein without departing from the spirit and scope of the following claims.

What is claimed is:
1. A semiconductor package comprising:
   a substrate including a first surface and a second surface;
   a semiconductor chip on at least one of the first surface and the second surface of the substrate; and
   a plurality of passive elements on the substrate, the plurality of passive elements including,
      a plurality of first passive elements, and
      a plurality of second passive elements that are taller than the plurality of first passive elements, wherein the plurality of first passive elements are mounted on at least one of the first surface and the second surface, and at least one of the plurality of second passive elements is mounted on the second surface, and the semiconductor chip vertically overlaps with at least one of the first passive elements, the at least one of the first passive elements mounted on a surface being opposite to the other surface on which the semiconductor chip is mounted.

2. The semiconductor package of claim 1, wherein the plurality of first passive elements comprise at least one of a capacitor and a resistor.

3. The semiconductor package of claim 1, wherein the plurality of second passive elements comprise at least one of an inductor, an oscillator, and a tantalum capacitor.

4. The semiconductor package of claim 1, wherein the semiconductor chip is on the first surface, a plurality of chip pads of the semiconductor chip are bonded to a plurality of connection pads of the substrate through a plurality of wires, the plurality of first passive elements are on the first surface, and a sealing member covers the semiconductor chip, the plurality of wires, and the plurality of first passive elements on the first surface.

5. The semiconductor package of claim 1, wherein the semiconductor chip is on the second surface, a plurality of chip pads of the semiconductor chip are bonded to a plurality of connection pads of the substrate through a plurality of wires, and a sealing member covers the semiconductor chip and the plurality of wires.

6. The semiconductor package of claim 1, wherein a plurality of chip pads of the semiconductor chip are bonded to a plurality of connection pads of the substrate through a plurality of solder balls, and an under-fill material is between the semiconductor chip and the substrate.

7. The semiconductor package of claim 1, further comprising:
an upper package on the first surface of the substrate.

8. A semiconductor package comprising:
a substrate including a first surface and a second surface;
a semiconductor chip on at least one of the first surface and the second surface of the substrate;
a plurality of passive elements on the substrate, the plurality of passive elements including,
a plurality of first passive elements, and
a plurality of second passive elements that are taller than the plurality of first passive elements; and
an upper package on the first surface of the substrate, wherein the plurality of first passive elements are mounted on at least one of the first surface and the second surface,
at least one of the plurality of second passive elements is on a surface of the upper package facing the substrate, and
the substrate includes at least one opening, through which the at least one second passive element on the upper package passes.

9. The semiconductor package of claim 1, wherein the semiconductor chip is on one of the first surface and the second surface of the substrate, and
a plurality of test connection pads are on the other one of the first surface and the second surface of the substrate.

10. A semiconductor package comprising:
a substrate including a first surface, a second surface and at least one opening;
a semiconductor chip on at least one of the first surface and the second surface of the substrate;
a plurality of passive elements, the plurality of passive elements including,
a plurality of first passive elements, and
a plurality of second passive elements that are taller than the plurality of first passive elements; and
an upper package on the first surface of the substrate, wherein
the plurality of first passive elements are mounted on at least one of the first surface and the second surface,
at least one of the plurality of second passive elements is mounted directly on a surface of the upper package facing the first surface of the substrate, the at least one second passive element on the upper package passing through the at least one opening, and
the remaining second passive elements are on the second surface of the substrate.

11. The semiconductor package of claim 10, wherein the semiconductor chip vertically overlaps with at least one of the first passive elements, the at least one of the first passive elements mounted on a surface being opposite to the other surface on which the semiconductor chip is mounted.

* * * * *